(12) United States Patent
Do et al.

(10) Patent No.: US 8,557,638 B2
(45) Date of Patent: Oct. 15, 2013

(54) INTEGRATED CIRCUIT PACKAGING SYSTEM WITH PAD CONNECTION AND METHOD OF MANUFACTURE THEREOF

(75) Inventors: Byung Tai Do, Singapore (SG); Arnel Senosa Trasporto, Singapore (SG); Linda Pei Ee Chua, Singapore (SG)

(73) Assignee: Stats Chippac Ltd., Singapore (SG)

( * ) Notice: Subject to any disclaimer, the term of this patent is extended or adjusted under 35 U.S.C. 154(b) by 259 days.

(21) Appl. No.: 13/102,041

(22) Filed: May 5, 2011

(65) Prior Publication Data

US 2012/0280377 A1 Nov. 8, 2012

(51) Int. Cl.
H01L 21/44 (2006.01)
H01L 21/48 (2006.01)
H01L 21/50 (2006.01)

(52) U.S. Cl.
USPC ............... 438/123; 257/676; 257/E23.031; 257/E21.505

(58) Field of Classification Search
None
See application file for complete search history.

(56) References Cited

U.S. PATENT DOCUMENTS

| | | |
|---|---|---|
| 6,498,099 B1 | 12/2002 | McLellan et al. |
| 7,262,491 B2 * | 8/2007 | Islam et al. ............... 257/670 |
| 2004/0070074 A1 * | 4/2004 | Sakamoto et al. ........... 257/734 |
| 2008/0308951 A1 | 12/2008 | Li et al. |
| 2010/0224971 A1 | 9/2010 | Li |
| 2011/0079888 A1 * | 4/2011 | Bathan et al. ................ 257/676 |
| 2012/0074547 A1 * | 3/2012 | Do et al. ..................... 257/676 |
| 2012/0074548 A1 * | 3/2012 | Camacho et al. ............ 257/676 |

OTHER PUBLICATIONS

U.S. Appl. No. 12/789,077, filed May 27, 2010, Camacho et al.

* cited by examiner

*Primary Examiner* — Thien F Tran
(74) *Attorney, Agent, or Firm* — Ishimaru & Associates LLP; I-Chang John Yang

(57) ABSTRACT

A method of manufacture of an integrated circuit packaging system includes: forming a peripheral lead having a peripheral lead bottom side, a peripheral lead top side, a peripheral lead non-horizontal side, a peripheral lead horizontal ridge, and a peripheral lead conductive plate, the peripheral lead horizontal ridge protruding from the peripheral lead non-horizontal side; forming a first top distribution layer on the peripheral lead top side, the first top distribution layer having a first top terminal; connecting an integrated circuit to the first top distribution layer, the integrated circuit having a central portion directly over a plurality of the first top terminal; and applying an insulation layer directly on a bottom extent of the first top distribution layer and a peripheral lead ridge lower side of the peripheral lead horizontal ridge.

10 Claims, 6 Drawing Sheets

INTEGRATED CIRCUIT PACKAGING SYSTEM WITH PAD CONNECTION AND METHOD OF MANUFACTURE THEREOF

CROSS-REFERENCE TO RELATED APPLICATION(S)

The present application contains subject matter related to a concurrently filed U.S. patent application Ser. No. 13/102,044 by Byung Tai Do, Arnel Senosa Trasporto, and Zigmund Ramirez Camacho entitled "Integrated Circuit Packaging System with Routed circuit lead array and Method of Manufacture Thereof". The related application is assigned to STATS ChipPAC Ltd. The subject matter thereof is incorporated herein by reference thereto.

TECHNICAL FIELD

The present invention relates generally to an integrated circuit packaging system, and more particularly to a system for an integrated circuit packaging system with connection.

BACKGROUND ART

Modern electronics, such as smart phones, personal digital assistants, location based services devices, enterprise class servers, or enterprise class storage arrays, are packing more integrated circuits into an ever-shrinking physical space with expectations for decreasing cost. Numerous technologies have been developed to meet these requirements. Some of the research and development strategies focus on new technologies while others focus on improving the existing and mature technologies. Research and development in the existing technologies can take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. The demand still continues for lower cost, smaller size and more functionality.

Thus, a need still remains for an integrated circuit packaging system including lower cost, smaller size, and more functionality. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a peripheral lead having a peripheral lead bottom side, a peripheral lead top side, a peripheral lead non-horizontal side, a peripheral lead horizontal ridge, and a peripheral lead conductive plate, the peripheral lead horizontal ridge protruding from the peripheral lead non-horizontal side; forming a first top distribution layer on the peripheral lead top side, the first top distribution layer having a first top terminal; connecting an integrated circuit to the first top distribution layer, the integrated circuit having a central portion directly over a plurality of the first top terminal; and applying an insulation layer directly on a bottom extent of the first top distribution layer and a peripheral lead ridge lower side of the peripheral lead horizontal ridge.

The present invention provides an integrated circuit packaging system, including: a peripheral lead having a peripheral lead bottom side, a peripheral lead top side, a peripheral lead non-horizontal side, a peripheral lead horizontal ridge, and a peripheral lead conductive plate, the peripheral lead horizontal ridge protruding from the peripheral lead non-horizontal side; a first top distribution layer on the peripheral lead top side; an integrated circuit connected to the first top distribution layer, the integrated circuit having a central portion directly over a plurality of the first top terminal; and an insulation layer directly on a bottom extent of the first top distribution layer and a peripheral lead ridge lower side of the peripheral lead horizontal ridge.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
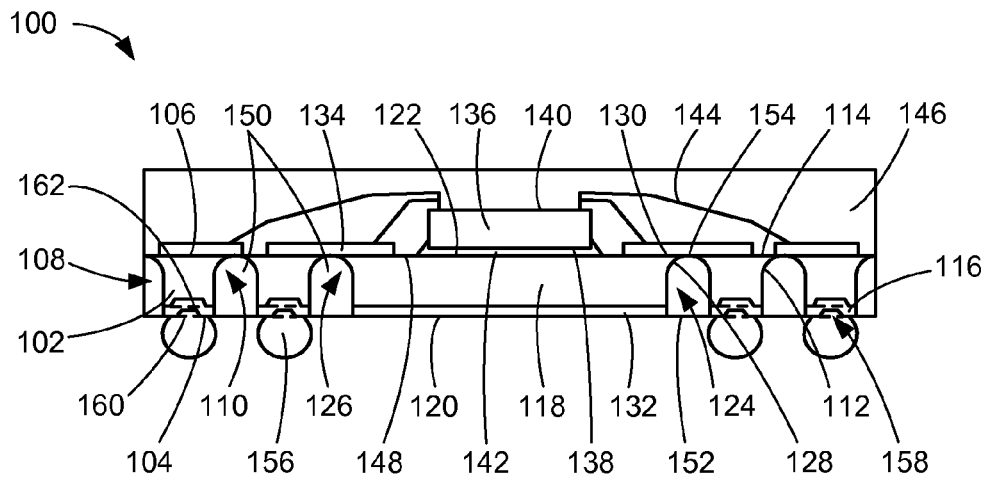
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Quad Flat No-Lead Stand-off Terminal (QFNs-st) multi-row packages have a problem with long wire spans and difficult wire-crossings. Longer wire span causes more wire usage and high cost of assembly. Due to complexity of bonding layout, another problem can occur with larger package sizes for Quad Flat No-Lead Stand-off Terminal (QFNs-st) packages require more expensive mold system. Embodiments of the present invention provide solutions or answers to the problem.

Figure 2:
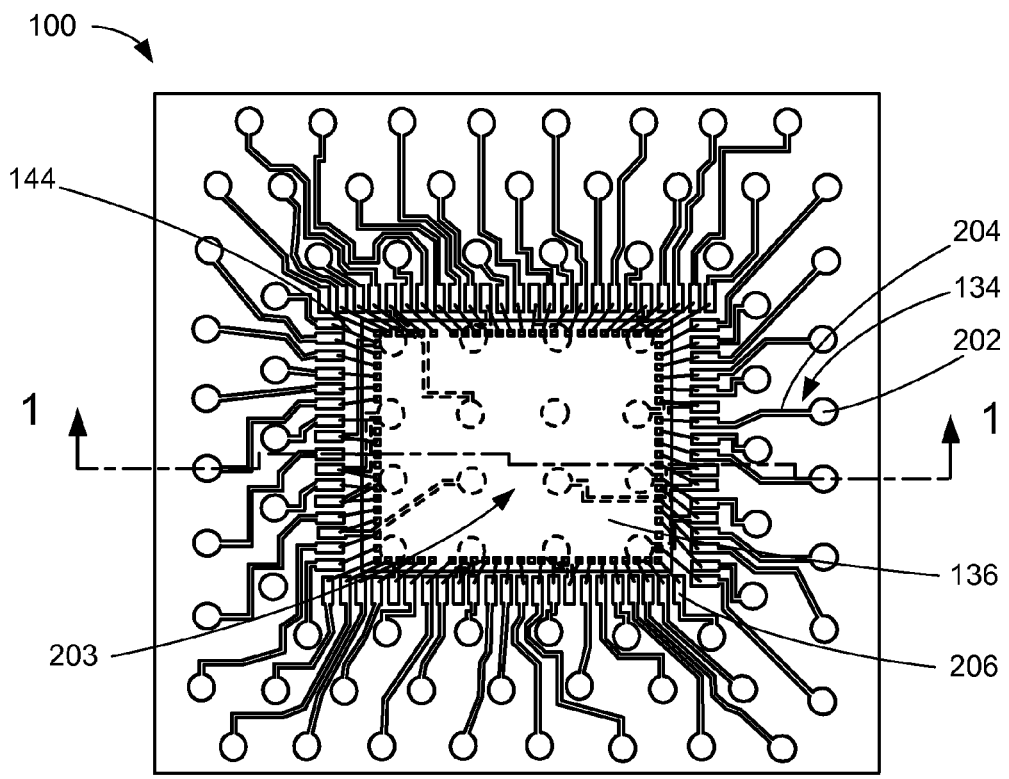
FIG. 2 is a first exemplary top plan view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include a quad flat no-lead (QFN) array.

The integrated circuit packaging system 100 can include a peripheral lead 102, which is defined as a structure that provides connectivity for electrical signals or electrical potential levels between the integrated circuit packaging system 100 and an external system (not shown). The integrated circuit packaging system 100 can include a plurality of the peripheral lead 102. For example, the peripheral lead 102 can represent an interconnection including a terminal or a pad.

The peripheral lead 102 can include a peripheral lead bottom side 104 and a peripheral lead top side 106 opposite the peripheral lead bottom side 104. The peripheral lead bottom side 104 and the peripheral lead top side 106 are defined as bottom and top sides, respectively, of the peripheral lead 102. The peripheral lead 102 can include a peripheral lead non-horizontal side 108 extending between the peripheral lead bottom side 104 and the peripheral lead top side 106.

The peripheral lead 102 can include a peripheral lead horizontal ridge 110, which is defined as an end of the peripheral lead 102 that horizontally protrudes from the peripheral lead non-horizontal side 108. The peripheral lead horizontal ridge 110 can extend from the peripheral lead top side 106. The peripheral lead horizontal ridge 110 can include a peripheral lead ridge lower side 112 and a peripheral lead ridge upper side 114 above the peripheral lead ridge lower side 112.

A plane of the peripheral lead ridge upper side 114 can be coplanar with a plane of the peripheral lead top side 106. A plane of the peripheral lead non-horizontal side 108 can intersect planes of the peripheral lead ridge upper side 114 and the peripheral lead top side 106. An intersection of a plane of the peripheral lead non-horizontal side 108 and planes of the peripheral lead ridge upper side 114 and the peripheral lead top side 106 can represent a dividing line or a boundary between the peripheral lead ridge upper side 114 and the peripheral lead top side 106.

For example, the peripheral lead ridge lower side 112 can include any surface including a curve surface or any non-planar surface. Also for example, the peripheral lead ridge upper side 114 can include any surface including a flat surface or any planar surface.

The peripheral lead 102 can include a peripheral lead conductive plate 116, which is defined as an attachment site providing electrical connection to the peripheral lead 102. The peripheral lead conductive plate 116 can be formed at the peripheral lead bottom side 104.

For example, the peripheral lead conductive plate 116 can be formed with bottom plating process on a terminal. Also for example, a bottom terminal, shown as the peripheral lead 102, can be plated or can be bare copper (Cu) depending on the application.

The integrated circuit packaging system 100 can include a package paddle 118, which is defined as a support structure for mounting a semiconductor thereon. The package paddle 118 can include a paddle bottom side 120 and a paddle top side 122 opposite the paddle bottom side 120. The paddle bottom side 120 and the paddle top side 122 are defined as bottom and top sides of the package paddle 118. The package paddle 118 can include a paddle non-horizontal side 124 extending between the paddle bottom side 120 and the paddle top side 122.

The package paddle 118 can include a paddle horizontal ridge 126, which is defined as an end of the package paddle 118 that horizontally protrudes from the paddle non-horizontal side 124. The paddle horizontal ridge 126 can extend from the paddle top side 122. The paddle horizontal ridge 126 can include a paddle ridge lower side 128 and a paddle ridge upper side 130 above the paddle ridge lower side 128.

A plane of the paddle ridge upper side 130 can be coplanar with a plane of the paddle top side 122. A plane of the paddle non-horizontal side 124 can intersect planes of the paddle ridge upper side 130 and the paddle top side 122. An intersection of a plane of the paddle non-horizontal side 124 and planes of the paddle ridge upper side 130 and the paddle top side 122 can represent a dividing line or a boundary between the paddle ridge upper side 130 and the paddle top side 122.

For example, the paddle ridge lower side 128 can include any surface including a curve surface or any non-planar surface. Also for example, the paddle ridge upper side 130 can include any surface including a flat surface or any planar surface.

The package paddle 118 can include a paddle conductive plate 132, which is defined as an attachment site providing electrical connection to the package paddle 118. The paddle conductive plate 132 can be formed at the paddle bottom side 120.

The integrated circuit packaging system 100 can include a first top distribution layer 134, which is defined as a structure that provides electrical connectivity between a semiconductor device and the peripheral lead 102. The first top distribution layer 134 routes electrical connection or redistributes electrical signals from an integrated circuit 136 to the peripheral lead 102.

The integrated circuit 136 is defined as a semiconductor device. The integrated circuit 136 can be over the first top distribution layer 134. The integrated circuit 136 can include an inactive side 138 and an active side 140 opposite the inactive side 138. For example, the integrated circuit 136 can include a semiconductor device including a wirebond chip, a flip chip, or a silicon (Si) die.

The integrated circuit packaging system 100 can include a plurality of the first top distribution layer 134. For example, the first top distribution layer 134 can represent an electrical connector including a top plate with a routed circuit or a distribution layer (RDL). Also for example, the first top distribution layer 134 can include a flat top.

The first top distribution layer 134 can be electrically connected to the peripheral lead 102. The first top distribution layer 134 can be formed directly on a portion of the peripheral lead top side 106, a portion of the paddle top side 122, or a combination thereof.

The integrated circuit 136 can include the inactive side 138 facing the paddle top side 122. The integrated circuit 136 can be mounted over the paddle top side 122 with an attach layer 142, which is defined as a die attach material or an adhesive material. The attach layer 142 can be attached to the paddle top side 122 and the inactive side 138.

The integrated circuit 136 can be between the peripheral lead 102 and another of the peripheral lead 102. The integrated circuit 136 can be surrounded by an array of a plurality of the peripheral lead 102. The peripheral lead 102 can surround a periphery of the integrated circuit 136.

The integrated circuit packaging system 100 can include an internal connector 144, which is defined as an electrically conductive connector connected or attached to the first top distribution layer 134 and the active side 140. The integrated circuit packaging system 100 can include a plurality of the internal connector 144. For example, the internal connector 144 can represent an electrical connector including a wire interconnect, a bond wire, or a conductive bump.

The integrated circuit packaging system 100 can include an encapsulation 146, which is defined as a package cover of a semiconductor package to seal a semiconductor device providing mechanical and environmental protection. The encapsulation 146 can be formed covering or over the peripheral lead top side 106, the paddle top side 122, the first top distribution layer 134, the integrated circuit 136, the attach layer 142, and the internal connector 144.

The encapsulation 146 can include an encapsulation bottom side 148. A plane of the encapsulation bottom side 148 can be coplanar with any one of planes of the peripheral lead top side 106, the paddle top side 122, and a bottom extent of the first top distribution layer 134.

The integrated circuit packaging system 100 can include an insulation layer 150, which is defined as a protection layer that protects a portion of the bottom extent of the first top distribution layer 134. The insulation layer 150 can include an insulation material including a passivation, a solder resist, an epoxy, or an adhesive.

The insulation layer 150 can be formed or applied directly on portions of the peripheral lead 102, the package paddle 118, the first top distribution layer 134, and the encapsulation 146. The insulation layer 150 can be formed or applied directly on the peripheral lead non-horizontal side 108, the peripheral lead ridge lower side 112, a horizontal extent of the peripheral lead conductive plate 116, the paddle non-horizontal side 124, the paddle ridge lower side 128, a horizontal extent of the paddle conductive plate 132, the bottom extent of the first top distribution layer 134, and the encapsulation bottom side 148.

The insulation layer 150 can electrically isolate the peripheral lead 102 from another of the peripheral lead 102 or the peripheral lead 102 from the package paddle 118. The insulation layer 150 can be formed surrounding the peripheral lead 102 and the package paddle 118. The insulation layer 150 can electrically isolate the first top distribution layer 134 from another of the first top distribution layer 134.

The insulation layer 150 can include an insulation bottom side 152 and an insulation top side 154 opposite the insulation bottom side 152. A plane of the insulation bottom side 152 can be coplanar with any one of planes of the peripheral lead bottom side 104 and the paddle bottom side 120. For example, a plane of the insulation bottom side 152 can be coplanar with any one of planes of a bottom extent of the peripheral lead conductive plate 116 and a bottom extent of the paddle conductive plate 132. A plane of the insulation top side 154 can be coplanar with any one of planes of the peripheral lead ridge upper side 114 and the paddle ridge upper side 130.

For illustrative purposes, a plane of the insulation bottom side 152 is shown coplanar with planes of the peripheral lead bottom side 104 and the paddle bottom side 120, although it is understood that a plane of the insulation bottom side 152 can be non-coplanar with any one of planes of the peripheral lead bottom side 104 and the paddle bottom side 120. For example, a plane of the insulation bottom side 152 can be lower or below any of planes of the peripheral lead bottom side 104 and the paddle bottom side 120.

The integrated circuit packaging system 100 can include an external connector 156, which is defined as an electrically conductive connector connected or attached to the peripheral lead conductive plate 116 and the external system. The integrated circuit packaging system 100 can include a plurality of the external connector 156.

For example, the external connector 156 can represent an electrical connector including a conductive ball. Also for example, the external connector 156 can be formed with a conductive material including solder, a metal, or a metallic alloy. For a specific example, the external connector 156 can represent a solder ball for enhancing board level reliability (BLR) performance.

The peripheral lead conductive plate 116 can include a recess 158 at the peripheral lead bottom side 104. The external connector 156 can be attached to a bottom extent of the peripheral lead conductive plate 116 and within the recess 158.

For example, the peripheral lead 102 can include a ball catch structure, shown as the peripheral lead conductive plate 116 having the recess 158, such that solder ball and printing method is adaptable providing locking enhancement for board level reliability improvement. The ball catch structure is defined as a structure having the peripheral lead conductive plate 116 with the recess 158 to provide a reliable connection site to attach the external connector 156 to the peripheral lead 102.

For illustrative purposes, the peripheral lead conductive plate 116 is shown with the recess 158, although it is understood that the peripheral lead conductive plate 116 can be formed without the recess 158. For example, as shown with dash lines, the peripheral lead conductive plate 116 can include a conductive plate bottom side 160 and a conductive plate top side 162, which are defined as bottom and top surfaces, respectively, of the peripheral lead conductive plate 116. The conductive plate bottom side 160 and the conductive plate top side 162 can be planar or flat. A plane of the conductive plate bottom side 160 can be approximately parallel to a plane of the conductive plate top side 162.

The integrated circuit packaging system 100 can include a multi-row lead frame with circuit routing. Bottom terminal can be plated, as shown with the peripheral lead 102 having the peripheral lead conductive plate 116, to protect from etching process as a way of forming individual terminals. A coating of a protective material or layer, as shown with the insulation layer 150, can be applied for protection or security of circuit or trace, as shown with the first top distribution layer 134 for example. The insulation layer 150 can be provided for protections from chemical etch out after assembly or undesired environmental conditions.

It has been discovered that the insulation bottom side 152 coplanar with the peripheral lead bottom side 104 and the paddle bottom side 120 provides protection for the peripheral lead 102 and the package paddle 118 thereby providing improved reliability.

It has been also discovered that the first top distribution layer 134 connected to the peripheral lead 102 and the integrated circuit 136 provides wire span reduction as well as package size reduction, cost savings, and elimination of complex bond layout.

It has been unexpectedly found that the peripheral lead 102 having the peripheral lead horizontal ridge 110 covered by the insulation layer 150 improves interlocking of the peripheral lead 102 or terminal by eliminating lead pullouts.

It has been unexpectedly determined that the peripheral lead conductive plate 116 having the recess 158 provides a reliable connection site to attach the external connector 156 to the peripheral lead 102, thereby resulting in greater than 5% of board level reliability (BLR) performance improvement with the "ball catch" structure compared to a non-ball catch or planar structure for quad flat no-lead (QFN) packages.

It has been unexpectedly ascertained that the insulation layer 150 improves reliability by isolating the first top distribution layer 134 from another of the first top distribution layer 134 or the peripheral lead 102 from another of the peripheral lead 102 thereby eliminating solder creep or electrical shorts.

It has been unexpectedly identified that the peripheral lead conductive plate 116 having the recess 158 provides a reliable electrical connection of the external connector 156 attached to the peripheral lead 102 and the external system.

Referring now to FIG. 2, therein is shown a first exemplary top plan view of the integrated circuit packaging system 100. The first exemplary top plan view is shown without the encapsulation 146 of FIG. 1.

The first top distribution layer 134 can include a first top terminal 202, which is defined as an electrical connection site providing electrical connectivity to the first top distribution layer 134. The first top terminal 202 can be directly on the peripheral lead top side 106 of FIG. 1.

An array of a plurality of the first top terminal 202 can be distributed across surfaces at the peripheral lead top side 106 or the paddle top side 122 of FIG. 1. The array is defined as a physical arrangement or distribution of the plurality of the first top terminal 202 over a surface area of the peripheral lead top side 106, the paddle top side 122, or a combination thereof. The array includes the plurality of the first top terminal 202 that is fully populated, evenly spaced, or a combination thereof.

The array can be outside of a perimeter of the integrated circuit 136. The array can also be within the perimeter of the integrated circuit 136 such that a central portion 203 of the integrated circuit 136 can be directly over the array of the plurality of the first top terminal 202. The central portion 203 is defined as a portion of the integrated circuit 136 at a center of the integrated circuit 136 and away from a perimeter of the integrated circuit 136.

The first top distribution layer 134 can include a first top conductive trace 204, which is defined as a conductive connector that provides or routes electrical connection between the first top terminal 202 and a first top finger 206. The first top finger 206 is defined as an electrical connection site for the internal connector 144 to attach to the first top distribution layer 134.

The first top conductive trace 204 can be directly on portions of the peripheral lead 102 and the package paddle 118 of FIG. 1. The first top conductive trace 204 can be directly on portions of the peripheral lead ridge upper side 114 of FIG. 1 and the paddle ridge upper side 130 of FIG. 1. For example, the first top conductive trace 204 can include an electrical connector including a distribution trace or a routed layer.

The first top finger 206 can be directly on a portion of the package paddle 118. The first top finger 206 can be directly on the paddle ridge upper side 130, the paddle top side 122, or a combination thereof. An array of a plurality of the first top finger 206 can be formed adjacent to or surrounding a perimeter of the integrated circuit 136. The array is defined as a physical arrangement or distribution of the plurality of the first top finger 206. The array includes a row of the plurality of the first top finger 206. The array can include the plurality of the first top finger 206 that is evenly spaced.

The attach layer 142 of FIG. 1 can be directly on a portion of the first top distribution layer 134 that is under the integrated circuit 136. For example, the attach layer 142 can be directly on a portion of the first top conductive trace 204 and the first top terminal 202 that are directly under the integrated circuit 136.

For illustrative purposes, the first top terminal 202 and the first top finger 206 are shown having circular and rectangular shapes, respectively, although it is understood that the first top terminal 202 and the first top finger 206 can include any shapes. For example, the first top finger 206 can include a circular shape.

It has been discovered that the integrated circuit 136 having the central portion 203 directly over an array of a plurality of the first top terminal 202 improves speed performance with less routing congestion due to an increase of routing area.

Figure 3:
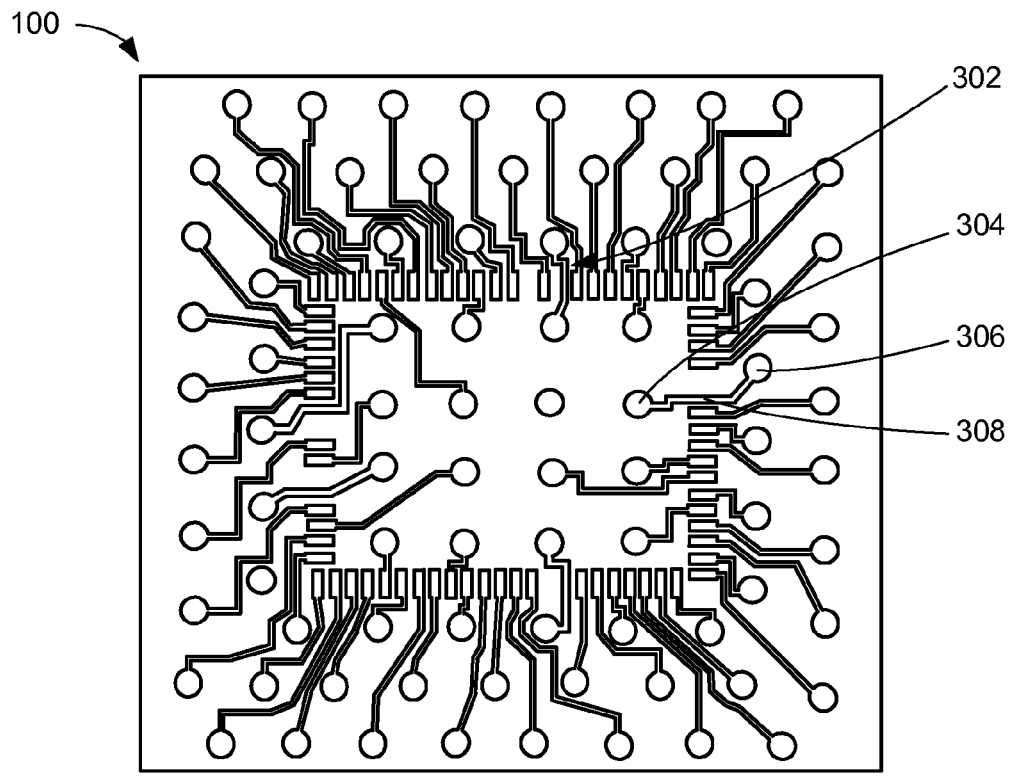
FIG. 3 is a second exemplary top plan view of the integrated circuit packaging system.

Referring now to FIG. 3, therein is shown a second exemplary top plan view of the integrated circuit packaging system 100. The second exemplary top plan view is shown without the integrated circuit 136 of FIG. 1, the internal connector 144 of FIG. 1, and the encapsulation 146 of FIG. 1.

The integrated circuit packaging system 100 can include a second top distribution layer 302, which is defined as a structure that provides electrical connectivity between the peripheral lead 102 of FIG. 1 and another of the peripheral lead 102. For example, the second top distribution layer 302 provides a fused or joined terminal option for ground bond or common voltage leads.

The second top distribution layer 302 can include a first reference terminal 304 electrically connected to a second reference terminal 306. The second top distribution layer 302 can include a second top conductive trace 308 electrically connected to the first reference terminal 304 and the second reference terminal 306. The second top conductive trace 308 can include a width larger than a width of the first top conductive trace 204 of FIG. 2.

The first reference terminal 304 and a portion of the second top conductive trace 308 can be directly under the integrated circuit 136. The second reference terminal 306 and another portion of the second top conductive trace 308 can be outside a perimeter of the integrated circuit 136. For example, the second top distribution layer 302 can distribute a ground signal from the first reference terminal 304 to the second reference terminal 306.

The first reference terminal 304 and a portion of the second top conductive trace 308 can be directly on a portion of the package paddle 118 of FIG. 1. The second reference terminal 306 and another portion of the second top conductive trace 308 can be directly on a portion of the peripheral lead 102.

The attach layer 142 of FIG. 1 can be directly on a portion of the second top distribution layer 302 that is under the integrated circuit 136. For example, the attach layer 142 can be directly on a portion of the second top conductive trace 308 and the first reference terminal 304 that are directly under the integrated circuit 136.

For illustrative purposes, the first reference terminal 304 and the second reference terminal 306 are shown having circular shapes, although it is understood that the first reference terminal 304 and the second reference terminal 306 can include any shapes. For example, the first reference terminal 304 can include a rectangular shape.

Figure 4:
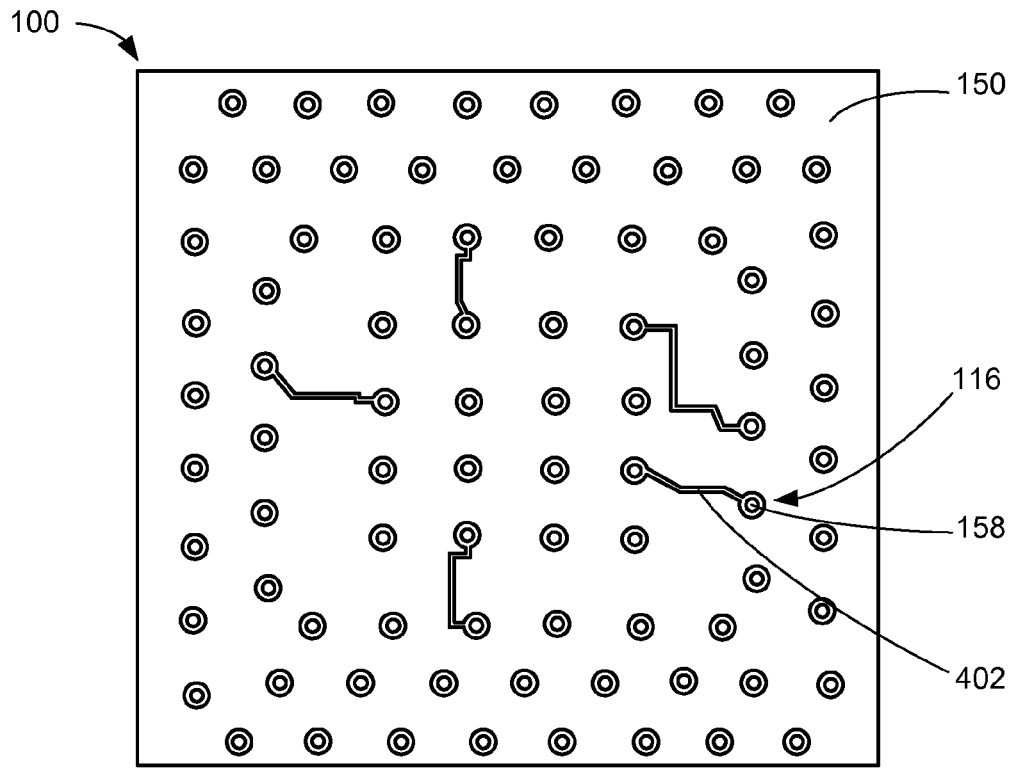
FIG. 4 is a bottom plan view of the integrated circuit packaging system.

Referring now to FIG. 4, therein is shown a bottom plan view of the integrated circuit packaging system 100. The bottom plan view is shown without the external connector 156 of FIG. 1. The bottom plan view depicts the insulation layer 150 surrounding the peripheral lead conductive plate 116 having the recess 158.

The integrated circuit packaging system 100 can include a bottom conductive trace 402, which is defined as an electrical connector that connects the peripheral lead conductive plate 116 and another of the peripheral lead conductive plate 116. The integrated circuit packaging system 100 provides the bottom conductive trace 402 as a fused or joined terminal option for ground bond or common voltage leads. For example, bottom terminal with routing, shown as the peripheral lead conductive plate 116 with the bottom conductive trace 402, can be provided for ground bond.

Figure 5:
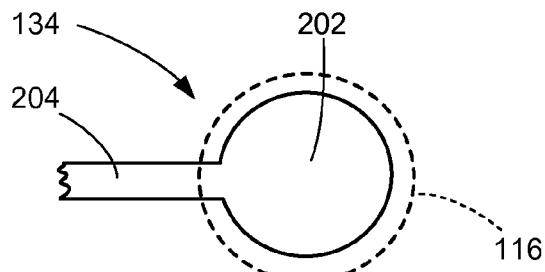
FIG. 5 is a top view of a portion of the first top distribution layer.

Referring now to FIG. 5, therein is shown a top view of a portion of the first top distribution layer 134. The first top distribution layer 134 can include the first top conductive trace 204 electrically connected to the first top terminal 202. The first top terminal 202 can include a surface area smaller than a surface area of the peripheral lead conductive plate 116.

The first top distribution layer 134 can include the first top terminal 202, the first top conductive trace 204, and the first top finger 206 of FIG. 2 formed as a single integral structure with a common electrically conductive material. The first top conductive trace 204 can be electrically connected to the first top terminal 202 and the first top finger 206.

For illustrative purposes, the top view is shown with the first top distribution layer 134, although it is understood that the top view can also apply to the second top distribution layer 302 of FIG. 3. For example, the second top distribution layer 302 can include the second reference terminal 306 of FIG. 3 having a surface area smaller than a surface area of the peripheral lead conductive plate 116.

Figure 6:
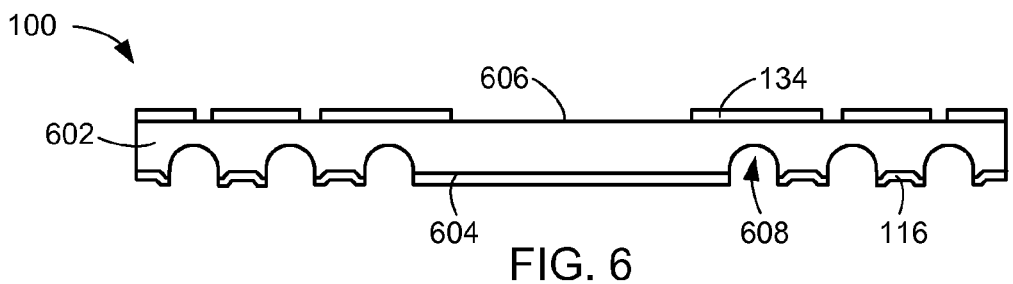
FIG. 6 is the structure of FIG. 1 in a plating phase of manufacture.

Referring now to FIG. 6, therein is shown the structure of FIG. 1 in a plating phase of manufacture. The integrated circuit packaging system 100 can include a leadframe 602, which is defined as a structure for mounting and connecting a semiconductor device thereto. The leadframe 602 can be formed with an electrically conductive material including copper (Cu) or any other metallic material.

The leadframe 602 can include a leadframe bottom side 604 and a leadframe top side 606 opposite the leadframe bottom side 604. A portion of the leadframe 602 at the leadframe bottom side 604 can be removed in a controlled manner to form a partially removed region 608. The partially removed region 608 can be formed with a removal process including etching. For example, the partially removed region 608 can be formed with the leadframe 602 half-etched.

As an example, the leadframe 602 can be provided with a structure pre-etched at the leadframe bottom side 604. As another example, the leadframe 602 can be provided with a structure that is not pre-etched and will be etched in a subsequent phase.

The integrated circuit packaging system 100 can include the peripheral lead conductive plate 116 formed at the leadframe bottom side 604. The peripheral lead conductive plate 116 can be formed with a number of layers. The peripheral lead conductive plate 116 can be formed with a lead plate conductive material, which is defined as an electrically conductive material including a metallic material or a metal alloy.

For example, the lead plate conductive material can include nickel (Ni), palladium (Pd), gold (Au), a metal alloy, or a combination thereof. For a specific example, the lead plate conductive material can include nickel-palladium (NiPd) or nickel-palladium-gold (NiPdAu).

As an example, the peripheral lead conductive plate 116 can be formed with a plating process. As another example, the peripheral lead conductive plate 116 can include a structure of a build-up pre plated frame (PPF).

The integrated circuit packaging system 100 can include the first top distribution layer 134 formed directly on the leadframe top side 606. The first top distribution layer 134 can be formed with a number of layers. The first top distribution layer 134 can be formed with a distribution layer conductive material, which is defined as an electrically conductive material including a metallic material or a metal alloy. For example, the distribution layer conductive material can include nickel (Ni), gold (Au), gold (Au) alloy, silver (Ag), a metal alloy, or a combination thereof.

As a specific example, the distribution layer conductive material can optionally include copper (Cu) or palladium (Pd). As another specific example, the distribution layer conductive material can include a seven-layer combination of gold (Au) (or gold (Au) alloy), palladium (Pd), nickel (Ni), copper (Cu), nickel (Ni), palladium (Pd), and gold (Au) (or gold (Au) alloy). As another specific example, the first top distribution layer 134 can include a five-layer combination of gold (Au) (or gold (Au) alloy), palladium (Pd), nickel (Ni), copper (Cu), and silver (Ag) with silver (Ag) as an alternative to three layers of nickel (Ni), palladium (Pd), and gold (Au) (or gold (Au) alloy) in the previous example.

As an example, the first top distribution layer 134 can be formed with a plating process. As another example, the first top distribution layer 134 can include a structure of a build-up pre plated frame (PPF).

In another embodiment, the first top distribution layer 134 can be formed with a step directly on a conductive layer on the leadframe top side 606. In a further embodiment, the first top distribution layer 134 can be formed with a step directly on and longer than a step of the leadframe 602 forming an overhang. In a yet further embodiment, a middle or central portion the leadframe 602 can include an array of a plurality of the partially removed region 608, an array of conductive plates at the leadframe bottom side 604, an array of distribution layers at the leadframe top side 606, or a combination thereof.

Figure 7:
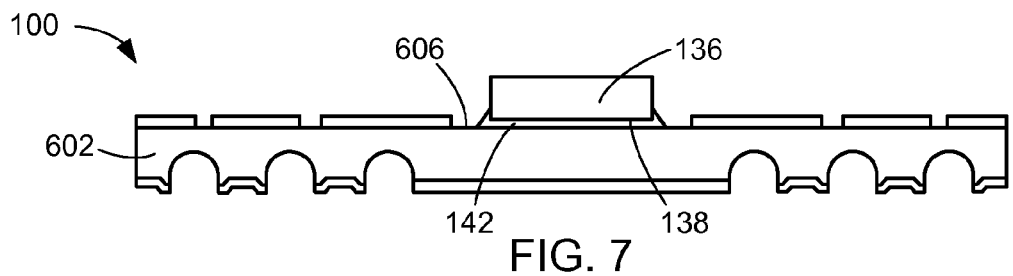
FIG. 7 is the structure of FIG. 6 in an attaching phase.

Referring now to FIG. 7, therein is shown the structure of FIG. 6 in an attaching phase. The integrated circuit packaging system 100 can include a die attach method to mount the integrated circuit 136 over the leadframe 602. The integrated circuit 136 can include the inactive side 138 facing the leadframe top side 606. The integrated circuit 136 can be attached to the leadframe top side 606 with the attach layer 142.

Figure 8:
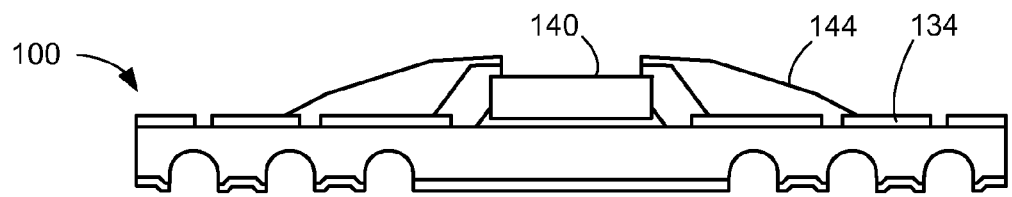
FIG. 8 is the structure of FIG. 7 in a connecting phase.

Referring now to FIG. 8, therein is shown the structure of FIG. 7 in a connecting phase. The integrated circuit packaging system 100 can include the internal connector 144 attached to the first top distribution layer 134 and the active side 140. The internal connector 144 can be attached directly on the first top finger 206 of FIG. 2.

For illustrative purposes, the internal connector 144 is shown as a bond wire, although it is understood that the internal connector 144 can include any other electrically conductive connectors. For example, the internal connector 144 can represent a conductive bump, a conductive stud, or a conductive paste. Also for example, the internal connector 144 can be formed with a conductive material including solder, a metal, or a metallic alloy.

Figure 9:
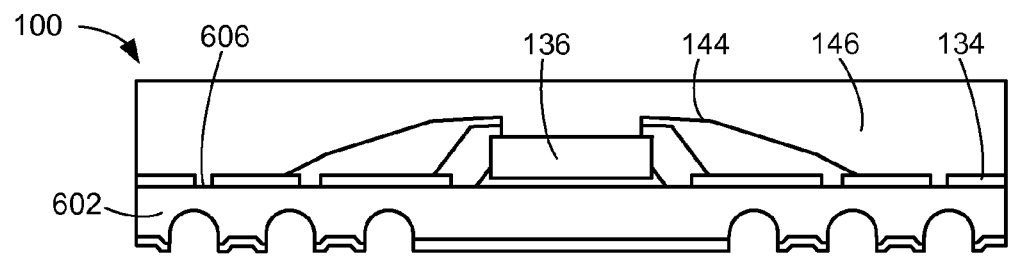
FIG. 9 is the structure of FIG. 8 in a molding phase.

Referring now to FIG. 9, therein is shown the structure of FIG. 8 in a molding phase. The integrated circuit packaging system 100 can include a molding process including liquid epoxy mold to form the encapsulation 146.

The encapsulation 146 can be molded over the leadframe 602, the first top distribution layer 134, the integrated circuit 136, and the internal connector 144. The encapsulation 146 can be formed covering the leadframe top side 606, the first top distribution layer 134, the integrated circuit 136, and the internal connector 144.

Figure 10:
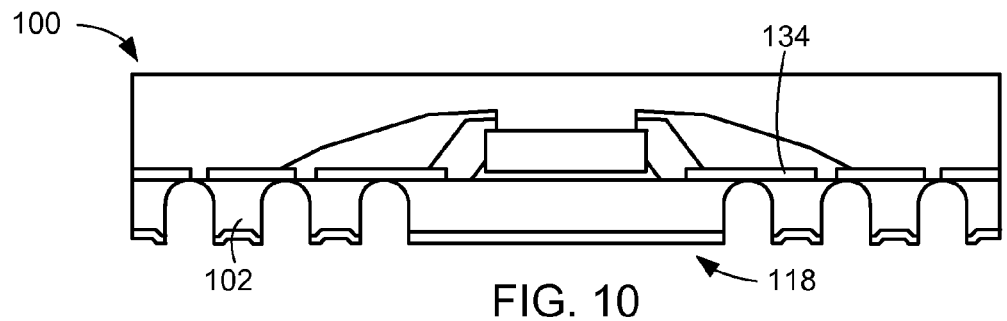
FIG. 10 is the structure of FIG. 9 in a removing phase.

Referring now to FIG. 10, therein is shown the structure of FIG. 9 in a removing phase. The integrated circuit packaging system 100 can include a removal process including etching in the removal phase. The removal process does not affect or remove the first top distribution layer 134. For example, the removal process can include a copper (Cu) etching.

A portion of the leadframe 602 of FIG. 6 at the leadframe bottom side 604 of FIG. 6 can be removed in the partially removed region 608 of FIG. 6 forming the peripheral lead 102 and the package paddle 118. Such removal of the portion of the leadframe 602 in the partially removed region 608 can expose a bottom portion of the first top distribution layer 134.

Figure 11:
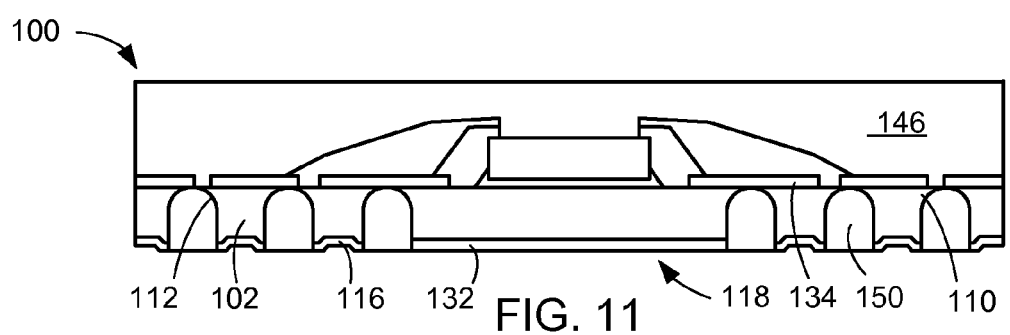
FIG. 11 is the structure of FIG. 10 in an applying phase.

Referring now to FIG. 11, therein is shown the structure of FIG. 10 in an applying phase. The integrated circuit packaging system 100 can include an application method including screen print, spin-coat, dispense, or capillary action. For example, the applying phase can include bottom trace protective layer, as shown with the insulation layer 150, after copper (Cu) etching process.

The integrated circuit packaging system 100 can include the insulation layer 150 applied or filled directly on portions of the peripheral lead 102, a horizontal extent of the peripheral lead conductive plate 116, the package paddle 118, a horizontal extent of the paddle conductive plate 132, the first top distribution layer 134, and the encapsulation 146. For example, the insulation layer 150 can provide protection for an exposed circuit, as shown by the first top distribution layer 134 partially exposed after the removing phase, from environmental hazards and elements.

The insulation layer 150 can protect bottom surfaces of the first top distribution layer 134 and the second top distribution layer 302 of FIG. 3. The insulation layer 150 can protect the bottom conductive trace 402 of FIG. 4.

The insulation layer 150 can electrically isolate the peripheral lead 102 and another of the peripheral lead 102. The insulation layer 150 can be formed surrounding the peripheral lead horizontal ridge 110. The insulation layer 150 can be formed directly on the peripheral lead ridge lower side 112.

In a subsequent phase, the integrated circuit packaging system 100 can include a package singulation process to produce individual units or packages of the integrated circuit packaging system 100. The package singulation process can include a mechanical or optical process.

Figure 12:
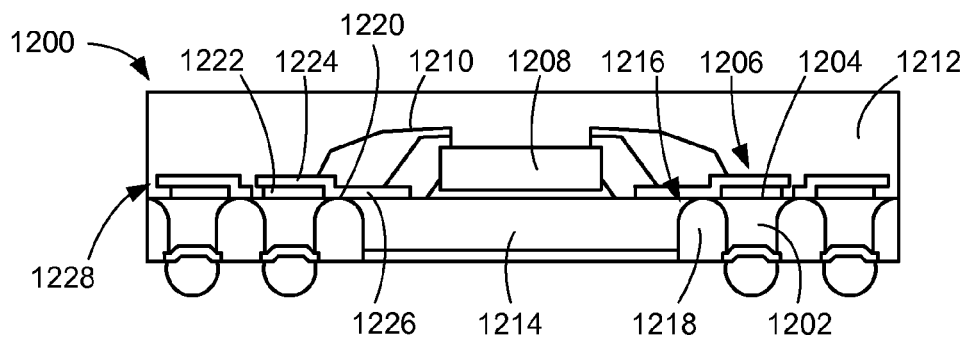
FIG. 12 is a cross-sectional view of an integrated circuit packaging system in a second embodiment of the present invention.

Referring now to FIG. 12, therein is shown a cross-sectional view of an integrated circuit packaging system 1200 in a second embodiment of the present invention. The integrated circuit packaging system 1200 can include a top plate with routed circuit and an optional overhang. The integrated circuit packaging system 1200 can include a two-copper (Cu) layer including a copper (Cu) cap.

In a manner similar to the integrated circuit packaging system 100 of FIG. 1, the integrated circuit packaging system 1200 includes a peripheral lead 1202 having a peripheral lead top side 1204. In a manner similar to the integrated circuit packaging system 100, the integrated circuit packaging system 1200 also includes a first top distribution layer 1206, an integrated circuit 1208, an internal connector 1210, and an encapsulation 1212.

In a manner similar to the integrated circuit packaging system 100, the integrated circuit packaging system 1200 includes a package paddle 1214 having a paddle horizontal ridge 1216. In a manner similar to the integrated circuit packaging system 100, the integrated circuit packaging system 1200 also includes an insulation layer 1218 having an insulation top side 1220.

The integrated circuit packaging system 1200 can include a conductive cap 1222, which is defined as a layer formed directly on the peripheral lead top side 1204. For example, the conductive cap 1222 can represent a second copper (Cu) layer used as copper (Cu) build up for mold interlocking.

The conductive cap 1222 can be formed with an electrically conductive material including copper (Cu) or any other metallic material. The conductive cap 1222 provides a raise structure above the peripheral lead top side 1204 so that a peripheral distribution step portion 1224 of the first top distribution layer 1206 can be formed above the peripheral lead top side 1204.

The first top distribution layer 1206 can include a peripheral distribution base portion 1226 integrally formed with the peripheral distribution step portion 1224. The peripheral distribution base portion 1226 is below the peripheral distribution step portion 1224. The insulation layer 1218 can be directly on a portion of a bottom extent of the peripheral distribution base portion 1226 to protect the first top distribution layer 1206.

The peripheral distribution base portion 1226 can be over the package paddle 1214 and the insulation layer 1218. The peripheral distribution base portion 1226 can be directly on the paddle horizontal ridge 1216 and the insulation top side 1220.

The peripheral distribution step portion 1224 can be directly on the conductive cap 1222. The peripheral distribution step portion 1224 can include a length longer than a length of the conductive cap 1222 such that the first top distribution layer 1206 can include a peripheral distribution overhang 1228 that laterally extends beyond a non-horizontal side of the conductive cap 1222.

The encapsulation 1212 can be formed over the peripheral lead top side 1204, the first top distribution layer 1206, and the conductive cap 1222. The encapsulation 1212 can be formed directly under a bottom extent of the peripheral distribution overhang 1228.

The integrated circuit packaging system 1200 can include a copper (Cu) build up (Cap) structure that has been plated with routing on top, as shown with the conductive cap 1222 and the first top distribution layer 1206. Such structure provides not only routing of signals that enable shorter wire bonds but also mold encapsulation interlock.

It has been discovered that the first top distribution layer 1206 having the peripheral distribution step portion 1224 extending beyond the conductive cap 1222 forming the peripheral distribution overhang 1228 significantly improves reliability with the encapsulation 1212 formed directly under the bottom extent of the peripheral distribution overhang 1228 providing mold encapsulation interlock.

Figure 13:
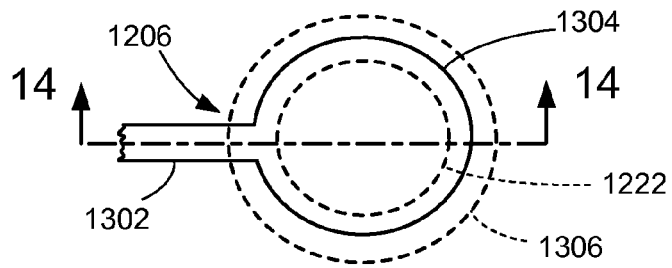
FIG. 13 is a top view of a portion of the first top distribution layer.

Referring now to FIG. 13, therein is shown a top view of a portion of the first top distribution layer 1206. The first top distribution layer 1206 can include a first top conductive trace 1302 connected to a first top terminal 1304. The first top terminal 1304 can include a surface area smaller than a surface area of a peripheral lead conductive plate 1306 of the peripheral lead 1202 of FIG. 12. The first top terminal 1304 can include a surface area larger than a surface area of the conductive cap 1222.

The first top distribution layer 1206 can include the first top terminal 1304 and the first top conductive trace 1302 formed as a single integral structure with a common electrically conductive material. The first top conductive trace 1302 can be electrically connected to the first top terminal 1304.

Figure 14:
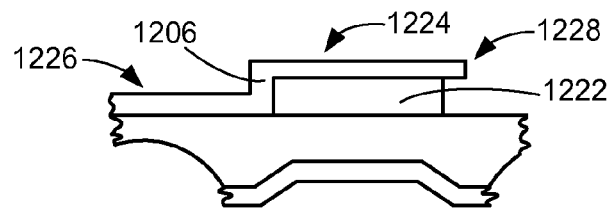
FIG. 14 is a cross-sectional view of the first top distribution layer taken along line 14-14 of FIG. 13.

Referring now to FIG. 14, therein is shown a cross-sectional view of the first top distribution layer 1206 taken along line 14-14 of FIG. 13. The first top distribution layer 1206 can include the peripheral distribution base portion 1226 integrally formed with the peripheral distribution step portion 1224. The peripheral distribution base portion 1226 can include the first top conductive trace 1302 of FIG. 13.

The peripheral distribution step portion 1224 can include the first top terminal 1304 of FIG. 13. The peripheral distribution step portion 1224 can be directly on the conductive cap 1222. The peripheral distribution step portion 1224 can include a length longer than a length of the conductive cap 1222 such that the first top distribution layer 1206 can include the peripheral distribution overhang 1228 that laterally extends beyond a non-horizontal side of the conductive cap 1222.

Figure 15:
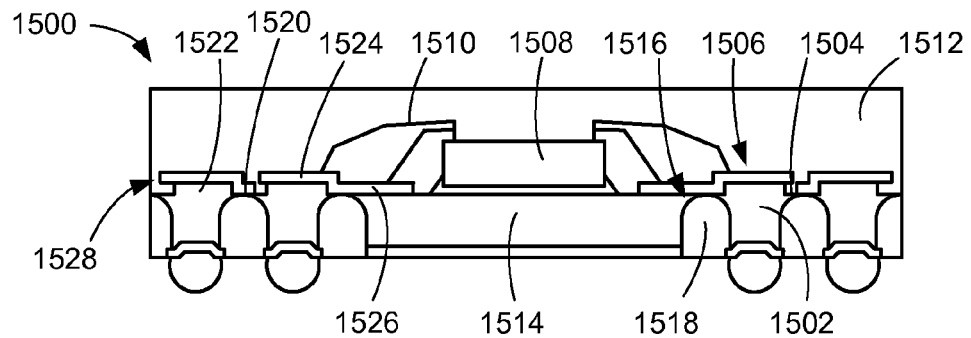
FIG. 15 is a cross-sectional view of an integrated circuit packaging system in a third embodiment of the present invention.

Referring now to FIG. 15, therein is shown a cross-sectional view of an integrated circuit packaging system 1500 in a third embodiment of the present invention. The integrated circuit packaging system 1500 can include thick copper (Cu) with top partial etching or copper (Cu) bump by partial etching.

In a manner similar to the integrated circuit packaging system 100 of FIG. 1, the integrated circuit packaging system 1500 includes a peripheral lead 1502 having a peripheral lead top side 1504. In a manner similar to the integrated circuit packaging system 100, the integrated circuit packaging system 1500 also includes a first top distribution layer 1506, an integrated circuit 1508, an internal connector 1510, and an encapsulation 1512.

In a manner similar to the integrated circuit packaging system 100, the integrated circuit packaging system 1500 includes a package paddle 1514 having a paddle horizontal ridge 1516. In a manner similar to the integrated circuit packaging system 100, the integrated circuit packaging system 1500 also includes an insulation layer 1518 having an insulation top side 1520.

The peripheral lead 1502 can include an integrally formed structure with a peripheral lead step portion 1522, which is defined as a layer formed over or vertically protruding from the peripheral lead top side 1504. For example, the peripheral lead step portion 1522 can represent a copper (Cu) post or a portion of a base leadframe copper (Cu). Also for example, the peripheral lead step portion 1522 can include a thick copper (Cu) with top partial etching.

The peripheral lead step portion 1522 can be formed with an electrically conductive material including copper (Cu) or any other metallic material. The peripheral lead step portion 1522 provides a raise structure above the peripheral lead top side 1504 so that a peripheral distribution step portion 1524 of the first top distribution layer 1506 can be formed above the peripheral lead top side 1504.

The first top distribution layer 1506 can include a peripheral distribution base portion 1526 integrally formed with the peripheral distribution step portion 1524. The peripheral distribution base portion 1526 is below the peripheral distribution step portion 1524. The insulation layer 1518 can be directly on a portion of a bottom extent of the peripheral distribution base portion 1526 to protect the first top distribution layer 1506.

The peripheral distribution base portion 1526 can be over the package paddle 1514 and the insulation layer 1518. The peripheral distribution base portion 1526 can be directly on the paddle horizontal ridge 1516 and the insulation top side 1520.

The peripheral distribution step portion 1524 can be directly on the peripheral lead step portion 1522. The peripheral distribution step portion 1524 can include a length longer than a length of the peripheral lead step portion 1522 such that the first top distribution layer 1506 can include a peripheral distribution overhang 1528 that laterally extends beyond a non-horizontal side of the peripheral lead step portion 1522.

The encapsulation 1512 can be formed over the peripheral lead top side 1504, the first top distribution layer 1506, and the peripheral lead step portion 1522. The encapsulation 1512 can be formed directly under a bottom extent of the peripheral distribution overhang 1528.

The integrated circuit packaging system 1500 can include partial copper (Cu) etching structure that has been plated with routing on top, as shown with the peripheral lead step portion 1522 and the first top distribution layer 1506. Such structure provides not only routing of signals that enable shorter wire bonds but mold encapsulation interlock as well.

It has been discovered that the first top distribution layer 1506 having the peripheral distribution step portion 1524 extending beyond the peripheral lead step portion 1522 forming the peripheral distribution overhang 1528 significantly improves reliability with the encapsulation 1512 formed directly under the bottom extent of the peripheral distribution overhang 1528 providing mold encapsulation interlock.

Figure 16:
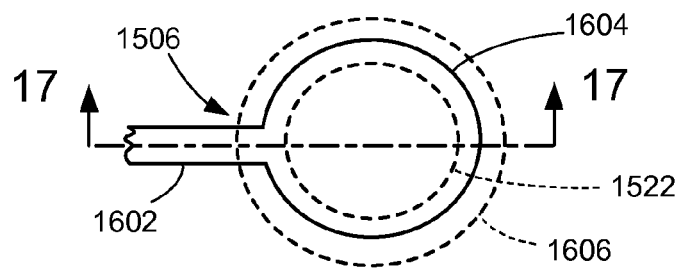
FIG. 16 is a top view of a portion of the first top distribution layer.

Referring now to FIG. 16, therein is shown a top view of a portion of the first top distribution layer 1506. The first top distribution layer 1506 can include a first top conductive trace 1602 connected to a first top terminal 1604. The first top terminal 1604 can include a surface area smaller than a surface area of a peripheral lead conductive plate 1606 of the peripheral lead 1502 of FIG. 15. The first top terminal 1604 can include a surface area larger than a surface area of the peripheral lead step portion 1522.

The first top distribution layer 1506 can include the first top terminal 1604 and the first top conductive trace 1602 formed as a single integral structure with a common electrically conductive material. The first top conductive trace 1602 can be electrically connected to the first top terminal 1604.

Figure 17:
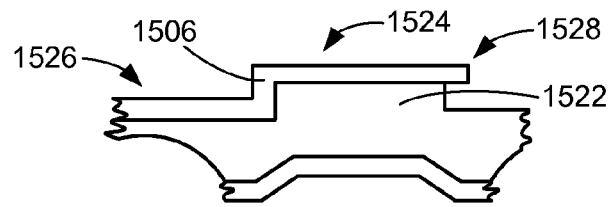
FIG. 17 is a cross-sectional view of the first top distribution layer taken along line 17-17 of FIG. 16.

Referring now to FIG. 17, therein is shown a cross-sectional view of the first top distribution layer 1506 taken along line 17-17 of FIG. 16. The first top distribution layer 1506 can include the peripheral distribution base portion 1526 integrally formed with the peripheral distribution step portion 1524. The peripheral distribution base portion 1526 can include the first top conductive trace 1602 of FIG. 16.

The peripheral distribution step portion 1524 can include the first top terminal 1604 of FIG. 16. The peripheral distribution step portion 1524 can be directly on the peripheral lead step portion 1522. The peripheral distribution step portion 1524 can include a length longer than a length of the peripheral lead step portion 1522 such that the first top distribution layer 1506 can include the peripheral distribution overhang 1528 that laterally extends beyond a non-horizontal side of the peripheral lead step portion 1522.

Figure 18:
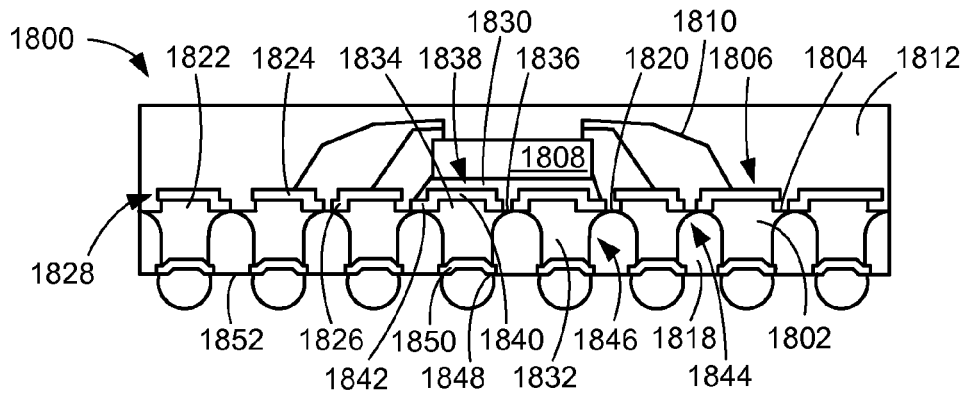
FIG. 18 is a cross-sectional view of an integrated circuit packaging system in a fourth embodiment of the present invention.

Referring now to FIG. 18, therein is shown a cross-sectional view of an integrated circuit packaging system 1800 in a fourth embodiment of the present invention. In a manner similar to the integrated circuit packaging system 100 of FIG. 1, the integrated circuit packaging system 1800 includes a peripheral lead 1802 having a peripheral lead top side 1804.

In a manner similar to the integrated circuit packaging system 100, the integrated circuit packaging system 1800 also includes a first top distribution layer 1806, an integrated circuit 1808, an internal connector 1810, and an encapsulation 1812. In a manner similar to the integrated circuit packaging system 100, the integrated circuit packaging system 1800 also includes an insulation layer 1818 having an insulation top side 1820.

The peripheral lead 1802 can include a peripheral lead step portion 1822, which is defined as a layer formed over or vertically extending from the peripheral lead top side 1804. The peripheral lead step portion 1822 can be formed with an electrically conductive material including copper (Cu) or any other metallic material. The peripheral lead step portion 1822 provides a raise structure above the peripheral lead top side 1804 so that a peripheral distribution step portion 1824 of the first top distribution layer 1806 can be formed above the peripheral lead top side 1804.

The first top distribution layer 1806 can include a peripheral distribution base portion 1826 integrally formed with the peripheral distribution step portion 1824. The peripheral distribution base portion 1826 is below the peripheral distribution step portion 1824. The insulation layer 1818 can be directly on a portion of a bottom extent of the peripheral distribution base portion 1826 to protect the first top distribution layer 1806.

The peripheral distribution base portion 1826 can be over the insulation layer 1818. The peripheral distribution base portion 1826 can be directly on the insulation top side 1820.

The peripheral distribution step portion 1824 can be directly on the peripheral lead step portion 1822. The peripheral distribution step portion 1824 can include a length longer than a length of the peripheral lead step portion 1822 such that the first top distribution layer 1806 can include a peripheral distribution overhang 1828 that laterally extends beyond a non-horizontal side of the peripheral lead step portion 1822.

In a manner similar to the integrated circuit packaging system 100, the integrated circuit packaging system 1800 includes an attach layer 1830, which is defined as a die attach material or an adhesive material. The integrated circuit packaging system 1800 can include a central lead 1832, which is defined as a structure that provides connectivity for electrical signals or electrical potential levels between the integrated circuit packaging system 100 and an external system (not shown).

The integrated circuit packaging system 1800 can include a full array of a plurality of the peripheral lead 1802 and the central lead 1832. It is understood that previously described embodiments can include a full array of a plurality of, for example, the peripheral lead 1802, the central lead 1832, or a combination thereof.

The integrated circuit packaging system 1800 can include a plurality of the central lead 1832 surrounded by or adjacent to a plurality of the peripheral lead 1802. At least a portion of the central lead 1832 can be directly under the integrated circuit 1808. The central lead 1832 can include a central lead step portion 1834, which is defined as an elevated portion of the central lead 1832 vertically extending above a central lead top side 1836 of the central lead 1832.

The integrated circuit packaging system 1800 can include a central top distribution layer 1838, which is defined as a structure that provides electrical connectivity between the integrated circuit 1808 and the central lead 1832. The central top distribution layer 1838 can include a central distribution step portion 1840 above a central distribution base portion 1842. The central distribution step portion 1840 can be directly on the central lead step portion 1834.

The central distribution base portion 1842 can be over the central lead top side 1836 and directly on a central lead horizontal ridge 1844, which is defined as an end of the central lead 1832 that horizontally protrudes from a central lead non-horizontal side 1846 of the central lead 1832. The central lead non-horizontal side 1846 extends between a central lead bottom side 1848 of the central lead 1832 and the central lead top side 1836.

The central lead 1832 can include a central lead conductive plate 1850, which is defined as an attachment site providing electrical connection to the central lead 1832. The central lead conductive plate 1850 can be formed at the central lead bottom side 1848. A portion of a bottom extent of the central lead conductive plate 1850 can represent the central lead bottom side 1848. A plane of the bottom extent of the central lead conductive plate 1850 can be coplanar with a plane of an insulation bottom side 1852 of the insulation layer 1818.

The encapsulation 1812 can be formed over the peripheral lead top side 1804, the first top distribution layer 1806, the peripheral lead step portion 1822, and the central top distribution layer 1838. The encapsulation 1812 can be formed directly under a bottom extent of the peripheral distribution overhang 1828.

It has been discovered that the first top distribution layer 1806 having the peripheral distribution step portion 1824 extending beyond the peripheral lead step portion 1822 forming the peripheral distribution overhang 1828 significantly improves reliability with the encapsulation 1812 formed directly under the bottom extent of the peripheral distribution overhang 1828 providing locking.

It has also been discovered that the central top distribution layer 1838 having the central distribution step portion 1840 above the central distribution base portion 1842 improves reliability with more surface area provided by the central top distribution layer 1838 for the attach layer 1830 to attach thereto and with improved interlocking provided by the central distribution base portion 1842 preventing lead pullout.

Figure 19:
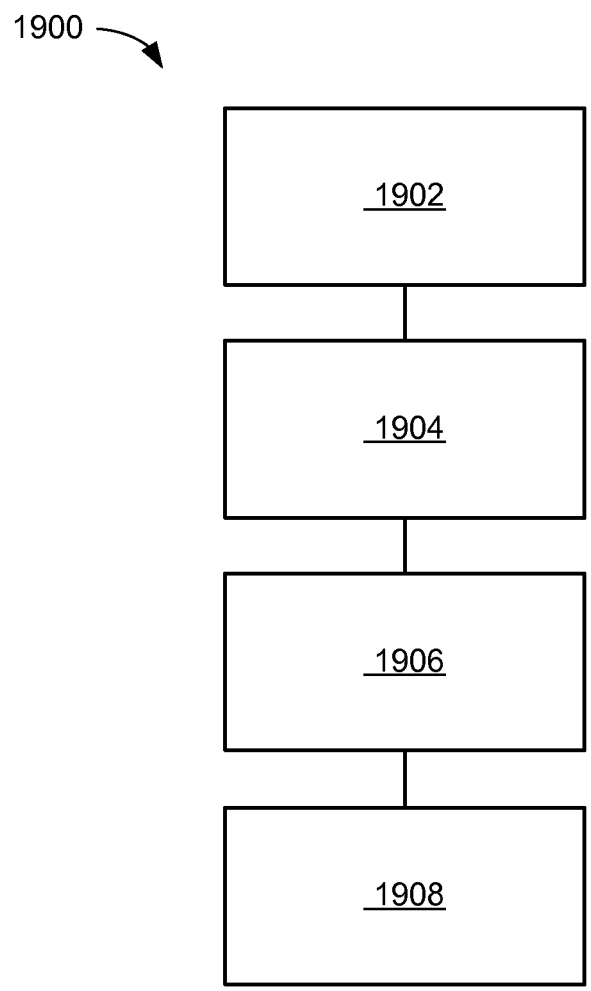
FIG. 19 is a flow chart of a method of manufacture of an integrated circuit packaging system in a further embodiment of the present invention.

Referring now to FIG. 19, therein is shown a flow chart of a method 1900 of manufacture of an integrated circuit packaging system in a further embodiment of the present invention. The method 1900 includes: forming a peripheral lead having a peripheral lead bottom side, a peripheral lead top side, a peripheral lead non-horizontal side, a peripheral lead horizontal ridge, and a peripheral lead conductive plate, the peripheral lead horizontal ridge protruding from the peripheral lead non-horizontal side in a block 1902; forming a first top distribution layer on the peripheral lead top side, the first top distribution layer having a first top terminal in a block 1904; connecting an integrated circuit to the first top distribution layer, the integrated circuit having a central portion directly over a plurality of the first top terminal in a block 1906; and applying an insulation layer directly on a bottom extent of the first top distribution layer and a peripheral lead ridge lower side of the peripheral lead horizontal ridge in a block 1908.

Thus, it has been discovered that the integrated circuit packaging system of the present invention furnishes important and heretofore unknown and unavailable solutions, capabilities, and functional aspects for an integrated circuit packaging system with connection. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method of manufacture of an integrated circuit packaging system comprising:
    forming a peripheral lead having a peripheral lead bottom side, a peripheral lead top side, a peripheral lead non-horizontal side, a peripheral lead horizontal ridge, and a peripheral lead conductive plate, the peripheral lead horizontal ridge protruding from the peripheral lead non-horizontal side;
    forming a first top distribution layer on the peripheral lead top side, the first top distribution layer having a first top terminal;
    connecting an integrated circuit to the first top distribution layer, the integrated circuit having a central portion directly over a plurality of the first top terminal; and
    applying an insulation layer directly on a bottom extent of the first top distribution layer and a peripheral lead ridge lower side of the peripheral lead horizontal ridge.

2. The method as claimed in claim 1 wherein forming the peripheral lead includes forming the peripheral lead having the peripheral lead conductive plate with a recess at the peripheral lead bottom side.

3. The method as claimed in claim 1 further comprising forming a conductive cap directly on the peripheral lead top side.

4. The method as claimed in claim 1 wherein forming the peripheral lead includes forming the peripheral lead having a peripheral lead step portion protruding from the peripheral lead top side.

5. The method as claimed in claim 1 further comprising forming a central lead directly under the integrated circuit.

6. A method of manufacture of an integrated circuit packaging system comprising:
    forming a peripheral lead having a peripheral lead bottom side, a peripheral lead top side, a peripheral lead non-horizontal side, a peripheral lead horizontal ridge, and a peripheral lead conductive plate, the peripheral lead horizontal ridge protruding from the peripheral lead non-horizontal side;
    forming a first top distribution layer on the peripheral lead top side;
    connecting an integrated circuit to the first top distribution layer, the integrated circuit having a central portion directly over a plurality of a first top terminal;
    forming an encapsulation over the integrated circuit and the first top distribution layer; and
    applying an insulation layer directly on a bottom extent of the first top distribution layer and a peripheral lead ridge lower side of the peripheral lead horizontal ridge.

7. The method as claimed in claim 6 wherein forming the peripheral lead includes forming the peripheral lead having the peripheral lead conductive plate with a recess at the peripheral lead bottom side and with a lead plate conductive material.

8. The method as claimed in claim 6 further comprising:
    forming a conductive cap directly on the peripheral lead top side; and
    wherein:
    forming the first top distribution layer includes forming the first top distribution layer directly on the conductive cap and having a distribution layer conductive material.

9. The method as claimed in claim 6 wherein:
    forming the peripheral lead includes forming the peripheral lead having a peripheral lead step portion protruding from the peripheral lead top side; and wherein:
  forming the first top distribution layer includes forming the first top distribution layer having a peripheral distribution step portion directly on the peripheral lead step portion.

10. The method as claimed in claim 6 further comprising forming a central lead directly under the integrated circuit and adjacent the peripheral lead.

* * * * *